United States Patent [19]
Maio

[11] 3,877,025
[45] Apr. 8, 1975

[54] ANALOG TO DIGITAL CONVERTER OF THE PARALLEL COMPARISON

[75] Inventor: Kenji Maio, Kokubunji, Japan
[73] Assignee: Hitachi, Ltd., Tokyo, Japan
[22] Filed: Sept. 28, 1973
[21] Appl. No.: 401,565

[30] Foreign Application Priority Data
Oct. 2, 1972 Japan ............................... 47-98059

[52] U.S. Cl. ........................ 340/347 AD; 307/235 R
[51] Int. Cl. ......................................... H03k 13/175
[58] Field of Search ...... 340/347 AD; 328/146, 147, 328/148; 307/235 R

[56] References Cited
UNITED STATES PATENTS 3,277,463 10/1966 Rosenberg ................... 340/347 AD
3,585,635 6/1971 Reiling ......................... 340/347 AD
3,597,761 8/1971 Fraschilla et al............ 340/347 AD

*Primary Examiner*—Malcolm A. Morrison
*Assistant Examiner*—R. Stephen Dilaine, Jr.
*Attorney, Agent, or Firm*—Craig & Antonelli

[57] ABSTRACT

An analog-to-digital converter for converting at a high rate an analog input signal into a digital signal by comparing it with a predetermined reference voltage parallelly. The converter comprises a plurality of parallel-connected comparators having window type comparison characteristics and each of which produces a binary-code signal of "1" or "0" only when the analog input signal is at a value within a window, that is, between a couple of reference voltages predetermined for respective comparators, and a code converter for converting the parallel output signals from the comparators into a series of binary-code signals having a predetermined number of bits.

5 Claims, 9 Drawing Figures

ANALOG TO DIGITAL CONVERTER OF THE PARALLEL COMPARISON

BACKGROUND OF THE INVENTION

1. Field of the Invention

This invention relates to an analog-to-digital converter (hereinafter referred to as "A-D converter"), or more in particular to an A-D converter of parallel comparison type effectively used for high-speed pattern recognition or data processing operations.

2. Description of the Prior Art

There are several kinds of A-D converters of parallel comparison type well known to those skilled in the art in a variety of fields of applications. A high-performance, low-cost converter is eagerly desired in the place of the well known A-D converters which, in spite of their high conversion rate, have the disadvantages that: (1) comparators as many as the number of quantization levels are required (7 comparators for 3 bits, and 15 comparators for 4 bits, for example), so that a great number of component elements are necessarily involved, resulting in the bulkiness and high cost of the device; and (2) when the analog input voltage is substantially the same as a reference voltage, the output from a comparator involved assumes a value between 1 and 0, and therefore a logical circuit in the next stage for code conversion is erroneously energized, thereby making an error in excess of one quantization level. For example, 001 may be erroneously produced as 101. The result is the necessity to take such measures as to increase the voltage gain or accuracy of the voltage comparators and to lessen the range of the input voltages corresponding to values between 1 and 0 of the output signals of the comparators.

SUMMARY OF THE INVENTION

Accordingly, it is an object of the invention to provide a low-cost A-D converter which has none of the above-mentioned disadvantages of the conventional converters and has a greatly simplified circuit arrangement.

To achieve the above-mentioned object, the invention employs a plurality of comparators having window comparison characteristics whereby it is determined between which reference voltages an input signal is, that is, in which window it is found. As such comparators of window type, dual type comparators in which at least a part of output circuit sections of two comparators is common to those two comparators are suitable.

DESCRIPTION OF THE PREFERRED EMBODIMENTS

Figure 1:
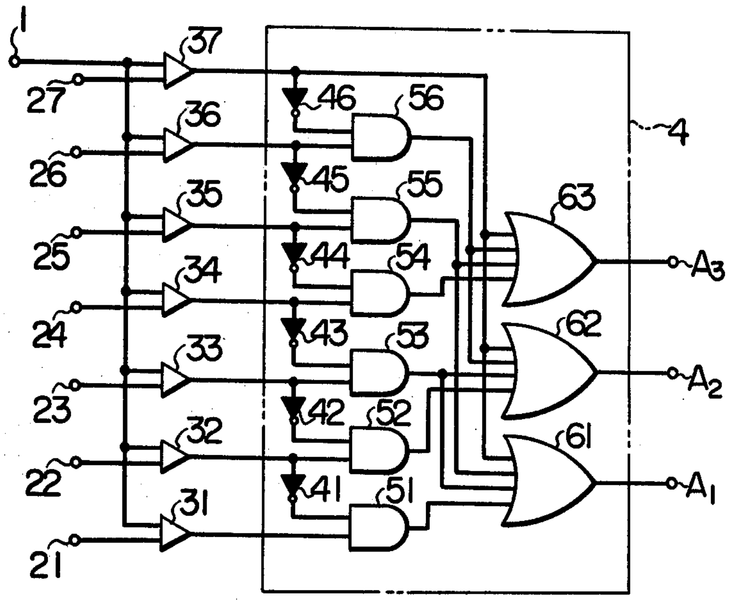
FIG. 1 PRIOR ART
FIG. 1 is a diagram showing an example of the conventional A-D converters.

A conventional 3-bit A-D converter of parallel comparison type is shown in FIG. 1. In the drawing, reference numeral 1 shows an analog input terminal, reference numerals 21 to 27 terminals to which reference voltages $Vs_1$ to $Vs_7$ ($Vs_1 < \ldots < Vs_7$) corresponding to different quantization levels are applied, numerals 31 to 37 voltage comparators, and numeral 4 means comprising typically the circuit as shown for converting the 1 and 0 signals from the comparators into binary-code numbers of 3 bits. The means 4 includes inverters 41 to 46, AND circuits 51 to 56 and OR circuits 61 to 63, which produce binary-code signals of 3 bits at the output terminals $A_1$, $A_2$ and $A_3$.

Referring to the operation of the abovementioned converter, when the analog input voltage is between $Vs_4$ and $Vs_5$, for example, the voltage comparators with reference voltages below $Vs_4$ produce output signals of 1, while the output signals from the voltage comparators in excess of $Vs_5$ are in the state of 0. As a result, only the AND circuit 54 among the circuits 51 to 56 is put into the state of 1, so that 1, 0 and 0 signals are produced at the output terminals $A_3$, $A_2$ and $A_1$ respectively. In spite of its very high conversion rate, this converter has the disadvantages already mentioned.

The principle on which the A-D converter according to the present invention performs its converting operation will be explained below.

Figure 2:
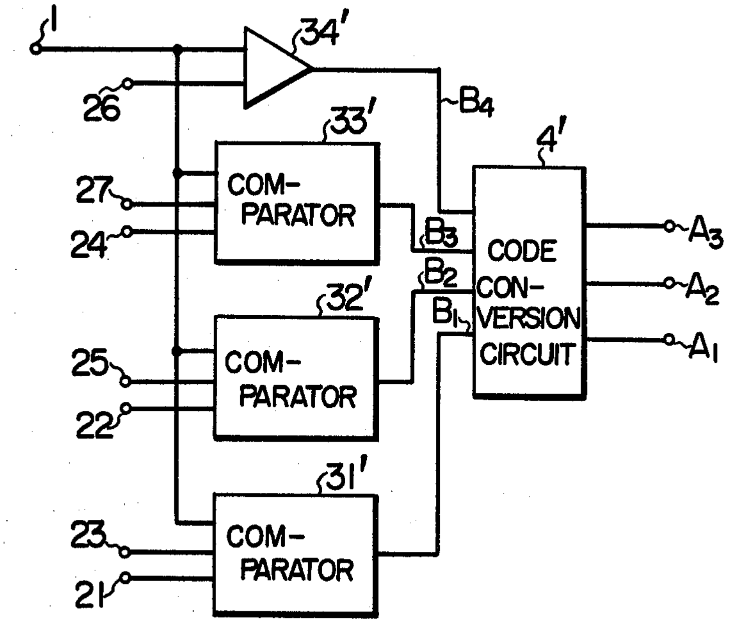
FIG. 2 is a schematic diagram showing the arrangement of the A-D converter according to the present invention.

The diagram of FIG. 2 schematically illustrates the arrangement of the A-D converter of parallel comparison type according to the present invention. Although an A-D converter of 3 bits is shown as in the case of FIG. 1 for convenience of explanation, it is apparent that the explanation hereafter applies with the same effect to A-D converters of $n$ bits. In FIG. 2, like numerals show like component elements as in FIG. 1.

Reference numerals 31' to 33' show voltage comparator circuits for producing window type comparison outputs which will be described later, numeral 34' a comparator with the same function as the comparators of FIG. 1, symbols $B_1$ to $B_4$ output signals from the comparator circuits 31' to 34', and numeral 4' a circuit for converting the digital signals $B_1$ to $B_4$ into binary-code signals of 3 bits which has the same function as the means 4 shown in FIG. 1.

Figure 3:
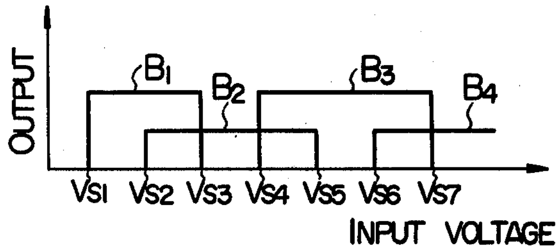
FIG. 3 is a diagram illustrating the input and output characteristics of the comparators included in the A-D converter of FIG. 2.

The operation of this converter will be explained now with reference to FIG. 3 showing the input and output characteristics of the comparator of window type. In the drawing, the abscissa represents input voltages, symbols $Vs_1$ to $Vs_7$ respectively showing reference voltages of the comparators, whereas the ordinate shows the states of outputs. In other words, when the input voltage is between the reference voltages $Vs_1$ and $Vs_2$, output signal $V_1$ is produced, while if it is between the reference voltages $Vs_2$ and $Vs_3$, the resulting output signals are $B_1$ and $B_2$. To explain more in detail, a signal of 1 is output from the voltage comparator circuit 31' only when the input level is between $Vs_1$ and $Vs_3$. In like manner, the comparators 32', 33' and 34' produce a signal of 1 when the input level is between $Vs_2$ and $Vs_5$, between $Vs_4$ and $Vs_7$ and in excess of $Vs_6$, respectively. The output signals $B_1$ to $B_4$ for different input levels are as shown in Table 1, from which it will be apparent that a desired 3-bit binary-code number is easily obtained by the use of an appropriate code conversion circuit 4'. (The values between two different reference voltages, for example, between $Vs_1$ and $Vs_2$ or between $Vs_2$ and $Vs_3$ will be hereafter referred to as a "window.")

Table 1

| input levels \ output | | $B_4$ | $B_3$ | $B_2$ | $B_1$ |
|---|---|---|---|---|---|
| 0 | (<$Vs_1$) | 0 | 0 | 0 | 0 |
| 1*a* | ($Vs_1$ to $Vs_2$) | 0 | 0 | 0 | 1 |
| 2*a* | ($Vs_2$ to $Vs_3$) | 0 | 0 | 1 | 1 |
| 3*a* | ($Vs_3$ to $Vs_4$) | 0 | 0 | 1 | 0 |
| 4*a* | ($Vs_4$ to $Vs_5$) | 0 | 1 | 1 | 0 |
| 5*a* | ($Vs_5$ to $Vs_6$) | 0 | 1 | 0 | 0 |
| 6*a* | ($Vs_6$ to $Vs_7$) | 1 | 1 | 0 | 0 |
| 7*a* | (<$Vs_7$) | 1 | 0 | 0 | 0 |

It will be seen from the above explanation that the features of the present invention are that 1. The circuit is simplified greatly as compared with the prior art A-D converter as shown in FIG. 1, so that A-D conversion is possible by the use of window type comparators only half in number of quantization levels.
2. no comparator with very high gain, that is, high accuracy is required. Even if the low gain causes an output of the comparators to be valued between 1 and 0, the level error detected is limited within one quantization level. When the input level is reference voltage $Vs_4$ in Table 1, the level detected will be 3*a* or 4*a*.

The invention will be explained below more in detail with reference to embodiments.

Figure 4:
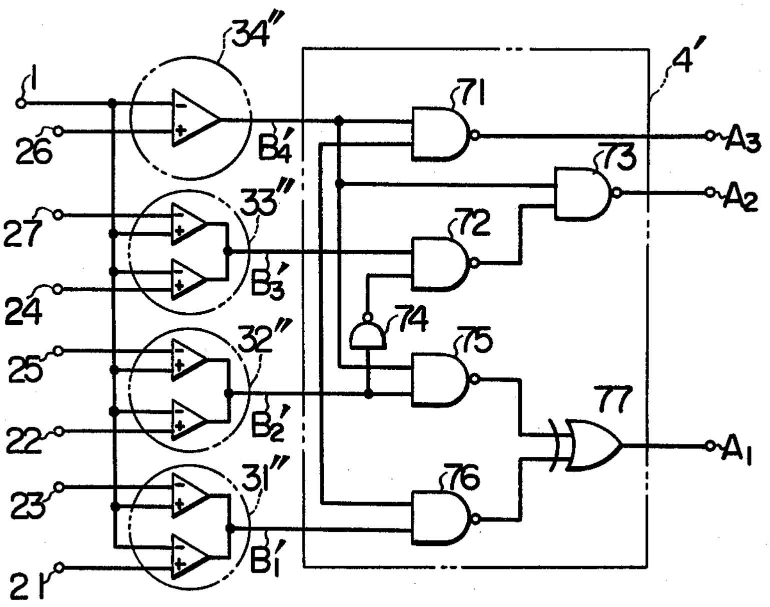
FIG. 4 shows an embodiment of the invention.

An embodiment of the invention is shown in FIG. 4, where like numerals denote like component elements as in FIG. 2. Reference numerals 31'' to 33'' show IC window comparators of dual type such as μA711 of Fairchild, numeral 34'' an ordinary comparator such as μA710 of Fairchild, numeral 4' a code conversion circuit, 71 to 76 NAND circuits, numeral 77 an exclusive OR circuit and $B_1'$ to $B_4'$ the outputs of the comparators 31'' to 34'' respectively. The output characteristics of the window comparators 31'', 32'', 33'' and 34'' are such that unlike those of the comparators 31', 32', 33' and 34' of FIG. 2, the windows are at zero level.

The window comparator 31'' of dual type, for example, comprises two comparator units 78 and 79 the outputs of which are applied to an AND circuit producing an output $B_1'$ as the result of its logical operation. The above-mentioned two comparators produce a 0 output when the input on their negative side is larger, so that the window comparator 31'' produces a 0 signal only when the analog input voltage is intermediate $Vs_1$ and $Vs_3$. The explanation of the code converter circuit 4' will be omitted since its only function is to effect logical conversion.

The output levels of each section of the circuit of FIG. 4 will be shown in Table 2 below.

Table 2

| input levels \ output | $B_4'$ | $B_3'$ | $B_2'$ | $B_1'$ | $A_3$ | $A_2$ | $A_1$ |
|---|---|---|---|---|---|---|---|
| 0 | 1 | 1 | 1 | 1 | 0 | 0 | 0 |
| 1*a* | 1 | 1 | 1 | 0 | 0 | 0 | 1 |
| 2*a* | 1 | 1 | 0 | 0 | 0 | 1 | 0 |
| 3*a* | 1 | 1 | 0 | 1 | 0 | 1 | 1 |
| 4*a* | 1 | 0 | 0 | 1 | 1 | 0 | 0 |
| 5*a* | 1 | 0 | 1 | 1 | 1 | 0 | 1 |
| 6*a* | 0 | 0 | 1 | 1 | 1 | 1 | 0 |
| 7*a* | 0 | 1 | 1 | 1 | 1 | 1 | 1 |

The outputs $B_1'$, $B_2'$, $B_3'$ and $B_4'$ shown in Table 2 are not more than the replacements of the 0 and 1 levels of the outputs $B_1$, $B_2$, $B_3$ and $B_4$ with each other. This is due to the differences in the characteristics of the comparators already mentioned.

The difference between the use of a window comparator of dual type and that of a couple of ordinary comparators lies in that:

1. among the recently developed comparators including integrated circuits, the comparator of dual type incorporating two comparator units is in use in twice the number but costs at most 50 percent more than the ordinary comparator employing only one comparator unit, so that the former is comparatively low in cost and contributes to the reduction of size. The reduction in size and cost is especially important for a high-speed pattern processing device of hybrid type which requires as many as 100 A-D converters; and
2. in spite of the fact that the comparator of dual type comprises a couple of comparator units, its output circuit section is common to both the units, thus simplifying the circuit arrangement.

It is for this reason that the use of a comparator of dual type as in the present invention is quite advantageous.

Another feature of the invention resides in the fact that the requirement of output lines for the comparators only about half in number compared with the conventional converter simplifies its logical circuit for code conversion. In other words, a series of binary code numbers of two bits are obtained through a code conversion circuit much simpler than the prior art converter as shown by numeral 4' of FIG. 4.

It is also the feature of the present invention that when an analog signal is converted into a digital signal of the desired number of bits, the adjacent quantization levels in conversion of the input signal, that is, the adjacent codes, the difference between which corresponds to the minute differences in analog input voltage do not change more than 1 bit and therefore the error attributable to indefinite coding may be maintained always less than one quantization level.

In the case of the conventional device as shown in FIG. 1, on the other hand, the comparator 35 takes the value between 1 and 0 when the input level is, say, $Vs_5$. On such occasion, the logical circuit in the code converter 4 may be erroneously energized, resulting in the production of a code quite different from the one corresponding to $Vs_5$.

Figure 5:
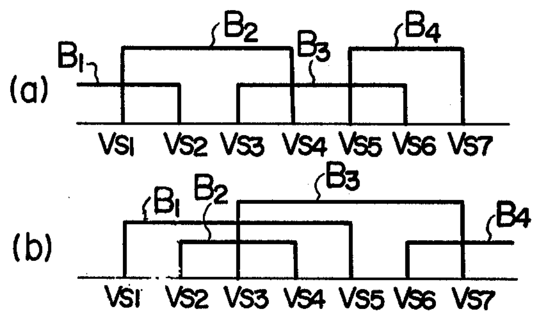
FIG. 5 is a diagram showing the input and output characteristics of FIG. 3 in another form.

Another form of the output characteristics shown in FIG. 3 is illustrated in FIG. 5. The window characteristics may take the form of either FIG. 5(*a*) or 5(*b*) or other modifications. Further, as already explained, the windows may be maintained at either 0 or 1 level.

Figure 6:
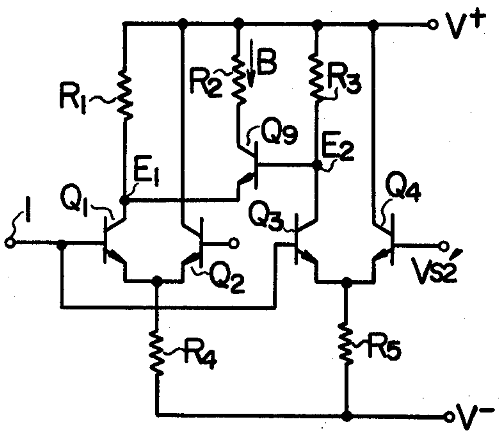
FIGS. 6 and 8 are circuit diagrams for explaining the operating principle of the window type comparators.

The diagram of FIG. 6 is for explaining another window type comparator used in the converter according to the present invention. The comparator of window type included in this drawing is different in construction from the comparator of dual type used in the device of FIG. 4. In this drawing, reference symbols $Q_1$ to $Q_5$ show transistors, among which each of the pairs $Q_1$, $Q_2$ and $Q_3$, $Q_4$ constitutes a differential comparator, so that the input voltage and reference voltage are applied respectively to the bases of a couple of transistors included in each of the pairs.

Reference symbol $Q_9$ shows another transistor, symbols $R_1$ to $R_5$ resistors, $V^+$ and $V^-$ source voltages, symbols $V's_1$ and $V's_2$ reference voltages, symbols $Vs_1'$ and $Vs_2'$ intermediate voltages between $Vs_1$ and $Vs_2$ and between $Vs_3$ and $Vs_4$, respectively, symbols $E_1$ and $E_2$ collector potentials of transistors $Q_1$ and $Q_2$ respectively, and symbol B current flowing in resistor $R_2$. It is assumed that the circuit is in the state of 1 when current B flows in the resistor $R_2$, while it is in the state of 0 when current B does not flow therein. When the voltage $Vi$ applied to the input terminal 1 connected to the bases of transistors $Q_1$ and $Q_3$ is lower than $Vs_1'$, the collector current flowing in the transistor $Q_1$ is substantially zero. As $V_1$ approaches $Vs_1$ ' that is a value slightly below $Vs_1$, the collector current begins to flow, thereby causing the potential $E_1$ to begin to be reduced. Under this condition, the collector current in the transistor $Q_3$ is zero, potential $E_2$ begin equal to $V^+$. With the increase in $Vi$, the potential $E_1$ is further lowered, so that $E_2$ being constant, the value $E_2$ minus $E_1$ reaches the voltage $V_{BE}$ which is a level sufficiently high to energize the transistor $Q_9$, with the result that when $V_{BE}$ equals $Vs_1$, current B becomes 1.

With further increase in $Vi$ to the neighborhood of $Vs_2'$, the potential $E_1$ is further reduced, while at the same time lowering the level of $E_2$ since $E_2 = E_1 + V_{BE}$. Under this condition, the transistor $Q_3$ also begins to conduct. Even further increase of voltage $Vi$ causes the transistor $Q_1$ to be saturated, thereby to prevent the potential $E_2$ from further decrease. With still further increase in Vi, the transistor $Q_2$ also begins to be saturated, whereby potential $E_2$ starts to be reduced independently of the potential $E_1$ until it finally becomes substantially equal to potential $E_1$. In other words, when the condition $E_2 - E_1 < V_{BE}$, the voltage of which is slightly greater than that of $Vs_3$, begins to be satisfied, transistor $Q_9$ is turned off, so that B becomes 0.

The result is the realization of the window type comparison characteristics in which with the increase in $Vi$, B transfers from 0 to 1 to 0. The threshold voltage for the transfer from 0 to 1 is determined mainly by $Vs_1'$, while the one for the transfer from 1 to 0 depends primarily upon the $Vs_2'$ and the gain of the differential comparator comprising the transistors $Q_3$ and $Q_4$.

Figure 9:
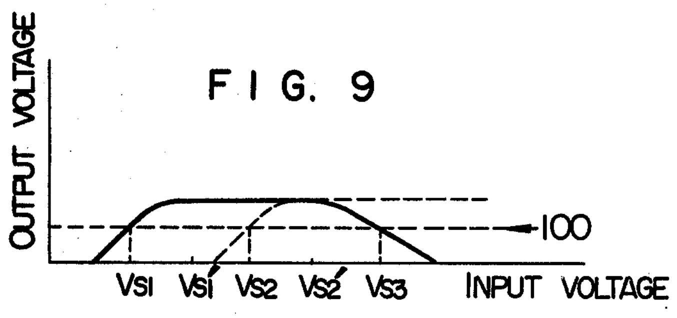
FIG. 9 is a diagram for explaining the operating principle of the circuit of FIG. 6.

The diagram of FIG. 9 is for explaining the operation of the circuit shown in FIG. 6. The abscissa represents the input voltage and the ordinate the output voltage appearing across the resistor $R_2$. The window characteristic is readily obtained by slicing such output voltage by the threshold voltage represented by 100. It will be easily seen that the window characteristic thus obtained is similar to that of the output $B_1$ shown in FIG. 3. Therefore, the characteristics quite the same as that of FIG. 3 is obtained by connecting a plurality of the circuits of FIG. 6 successively.

Further, if circuits similar to the circuit comprising transistors $Q_2$, $Q_3$ and $Q_4$ are inserted in the stage following the transistors $Q_3$ and $Q_4$, it is possible to obtain continuous window type comparison characteristics.

Figure 7:
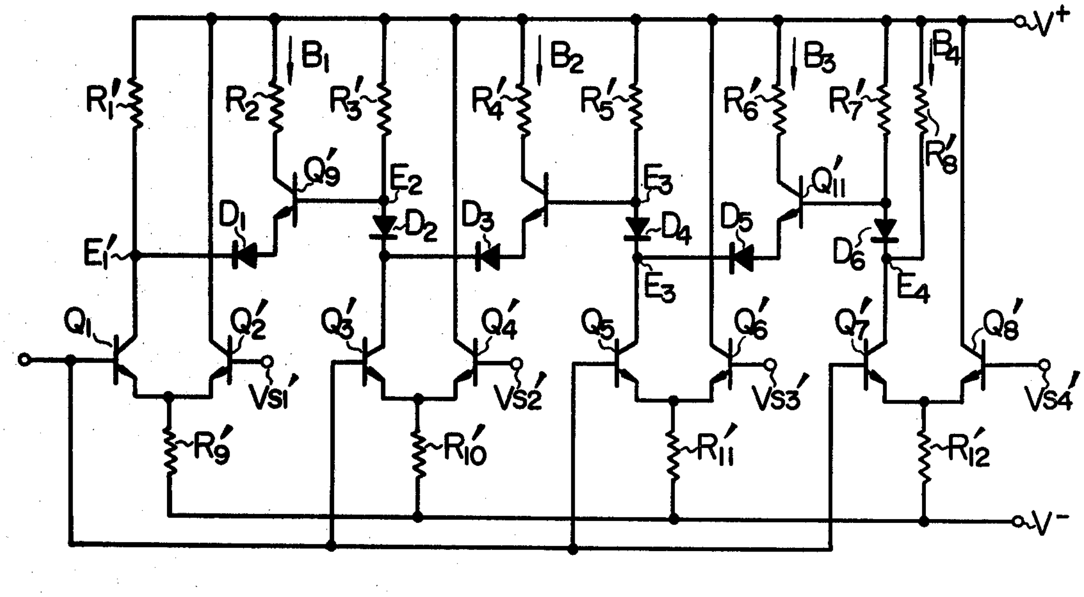
FIG. 7 is a diagram for explaining the series connection of the circuit shown in FIG. 6.

An example of such continuous connections of the circuit shown in FIG. 6 is illustrated in FIG. 7, where symbols $Q_1'$ to $Q_{11}'$ show transistors, $D_1$ to $D_6$ diodes, $R_1'$ to $R_{12}'$ resistors, $Vs_1'$ to $Vs_4'$ reference voltages, and $B_1$ to $B_4$ output currents.

The fundamental operating principle of this circuit is the same as that of the circuit of FIG. 6. In other words, a system including the transistors $Q_1'$ to $Q_4'$ and $Q_9'$ make up one window type comparison characteristic. In like manner, the system comprising the transistors $Q_3'$ to $Q_6'$ and $Q_{10}'$ and the system including the transistors $Q_3'$ to $Q_8'$ and $Q_{11}'$ each makes up one window type comparison characteristic. Finally, the system including the transistors $Q_7'$ to $Q_8'$ and resistor $R_3'$ makes up a circuit equivalent to the comparator 34' shown in FIG. 2. The diode $D_2$ is provided for the purpose of preventing the emitter current of the transistor $Q_{10}'$ from flowing toward the transistor $Q_9'$ when the transistor $Q_9'$ is conducting, the other diodes $D_4$ and $D_6$ functioning in a manner similar to the last-mentioned transistors. The diodes $D_1$, $D_3$ and $D_5$ are for compensating for the potential increases due to the forward voltages in the diodes $D_2$, $D_4$ and $D_6$ respectively.

In FIG. 7, the resistors $R_9'$ to $R_{12}'$ may be replaced by a constant current source. In such a case, the potentials $E_1$ to $E_4$ are determined by the value of the constant current source and the resistors $R_1'$, $R_3'$, $R_5'$, $R_7'$ and $R_8'$. By properly adjusting these elements, it is possible to obtain the characteristics similar to those of the circuit shown in FIG. 7.

Also, the fact that the transistors $Q_1'$ to $Q_3'$ are used within their unsaturated ranges, a higher response speed results. Furthermore, the need for the diodes $D_1$, $D_3$ and $D_5$ is eliminated.

Figure 8:
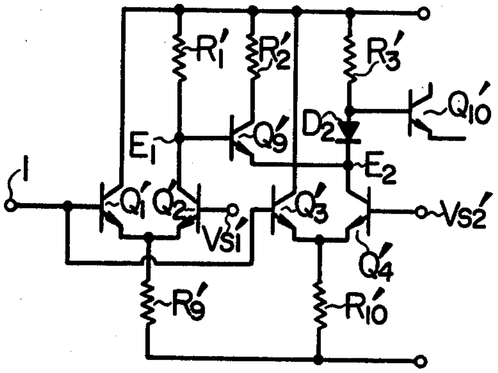

As another modification of the circuit shown in FIG. 7, the NPN transistors $Q_9'$ to $Q_{11}'$ may be replaced by as many PNP transistors. In still another possible modification, the emitter and base of the transistor $Q_7'$ may be alternatively connected to the collectors of the transistors $Q_4'$ and $Q_2'$ respectively, as shown in FIG. 8. From this drawing, it is apparent that the resistors $R_1'$ and $R_3'$ are connected to the collectors of the transistors $Q_2'$ and $Q_4'$. Similar connections are naturally effected in the following stages.

In order to change the quantization level of the window type comparison characteristics, either the reference voltage may be changed or an emitter resistor is inserted in the emitter of each of the transistors $Q_1'$ to $Q_3'$ thereby to change the voltage gain of each differential comparator.

The features of the A-D converters shown in FIGS. 7 and 8 their modifications are as follows:

1. The number of comparators required is about half that of the conventional device;
2. The simple arrangement of and fewer component elements included in the comparator circuit makes possible reduction in size and cost thereof. Introduction of integrated circuits is also easy;
3. A high response speed is realized due to the small number of transistor stages employed in the comparators. The result of an experiment conducted with the circuit of FIG. 7 shows that delay in conversion was not more than 20 + 1 seconds.

It will be understood from the detailed description above that the use of a comparator having the window type comparison characteristics permits the circuit arrangement to be simplified, resulting in sharp reduction in both size and cost of the converter.

I claim:

1. An analog-to-digital converter of parallel comparison type comprising a plurality of comparator means each producing a binary-code signal of a predetermined level only when an analog input signal applied to said comparator means is between two reference voltages predetermined for said comparator means, said reference voltages being predetermined in a multiplicity of stages corresponding to the quantization of the analog input signals, said reference voltages being applied to respective comparator means being different from one another, and code conversion means for converting parallel binary-code signals obtained from said comparator means into a series of binary-code signals having the number of bits related to the number of quantization levels, said plurality of comparator means including a plurality of differential comparators and a plurality of output transistors each inserted between two adjacent differential comparators, each of said differential comparators including at least two transistors, each of said output transistors having an emitter connected to the collector of one of the two transistors of the first of the adjacent differential comparators and having a base connected to the collector of one of the two transistors of the second of the adjacent differential comparators, said output transistors being turned on and off by the potential differences of the collector outputs of said two differential comparators, thereby forming window type comparison characteristics.

2. An analog-to-digital converter according to claim 1, wherein said plurality of differential comparators are equal in number to$(n + 1)/2$ where the numer of quantization levels n is an odd number.

3. An analog-to-digital converter according to claim 1, wherein said plurality of differential comparators are equal in number to $n/2$ where the number of quantization levels n is an even number.

4. An analog-to-digital converter of parallel comparison type comprising a plurality of comparator means each producing a binary-code output signal of a predetermined level only when an analog input signal applied to said comparator means is between two reference voltages predetermined for said comparator means, said comparator means each having two comparators including at least a part of an output circuit section common to said two comparators, said reference voltages being predetermined in a multiplicity of stages corresponding to the quantization levels of the analog input signals, the reference voltages applied to respective comparator means being different from one another, and code conversion means for converting parallel binary-code signals obtained from said comparator means into a series of binary-code signals having the number of bits related to the number of quantization levels.

5. An analog-to-digital converter according to claim 4, wherein said comparator means are dual type comparators.

* * * * *